US012690377B2

(12) United States Patent (10) Patent No.: US 12,690,377 B2
Jang (45) Date of Patent: Jul. 21, 2026

(54) MASK FOR DEPOSITION

(71) Applicant: Samsung Display Co., LTD., Yongin-si (KR)

(72) Inventor: Minji Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 426 days.

(21) Appl. No.: 18/347,809

(22) Filed: Jul. 6, 2023

(65) Prior Publication Data

US 2024/0107866 A1     Mar. 28, 2024

(30) Foreign Application Priority Data

Sep. 22, 2022     (KR) ........................ 10-2022-0119992

(51) Int. Cl.
| *C23C 14/04* | (2006.01) |
| *H10K 59/70* | (2023.01) |
| *H10K 71/16* | (2023.01) |
| *H10K 71/20* | (2023.01) |

(52) U.S. Cl.
CPC ......... *H10K 71/166* (2023.02); *C23C 14/042* (2013.01); *H10K 59/70* (2023.02); *H10K 71/20* (2023.02)

(58) Field of Classification Search
None
See application file for complete search history.

(56) References Cited

U.S. PATENT DOCUMENTS

| 2014/0312318 A1* | 10/2014 | Choi ..................... C23C 14/042 |
| | | 438/34 |
| 2015/0007768 A1* | 1/2015 | Lee ..................... C23C 14/042 |
| | | 118/504 |
| 2020/0208259 A1* | 7/2020 | Shin ..................... C23C 14/042 |
| 2021/0135112 A1* | 5/2021 | Kim ..................... C23C 14/042 |
| 2021/0175295 A1 | 6/2021 | Lee et al. |

FOREIGN PATENT DOCUMENTS

| KR | 10-1182442 | 9/2012 |
| KR | 20140125180 A | 10/2014 |
| KR | 20150006255 A | 1/2015 |
| KR | 10-2018-0085114 | 7/2018 |
| KR | 10-2018-0089925 | 8/2018 |
| KR | 10-2020-0069317 | 6/2020 |
| KR | 20210074177 A | 6/2021 |

* cited by examiner

*Primary Examiner* — Binu Thomas
(74) *Attorney, Agent, or Firm* — CANTOR COLBURN LLP

(57) ABSTRACT

An embodiment provides a deposition mask including an opening area including an opening; a first dummy opening area disposed at a first side of the opening area in a first direction and having a first dummy opening in the first dummy opening area; and a second dummy opening area disposed at a second side of the opening area in the first direction and having a second dummy opening in the second dummy opening area. A first side and a second side of the opening are asymmetrical with respect to a second direction intersecting the first direction, and the first dummy opening and the second dummy opening are symmetrical with the opening with respect to the second direction.

17 Claims, 17 Drawing Sheets

MASK FOR DEPOSITION

CROSS-REFERENCE TO RELATED APPLICATION(S)

This application claims priority to and benefits of Korean Patent Application No. 10-2022-0119992 under 35 U.S.C. § 119, filed in the Korean Intellectual Property Office on Sep. 22, 2022, the entire contents of which are incorporated herein by reference.

BACKGROUND

1. Technical Field

This disclosure relates to a deposition mask, and, to a deposition mask that can be used in manufacturing a display device.

2. Description of the Related Art

A deposition mask (hereinafter, simply referred to as a mask) may be used in manufacturing an electronic device such as a display panel. A metal mask such as a fine metal mask or an open mask may be used in a deposition process for forming an emission layer, an electrode layer, and the like on a substrate. For example, emission layers conforming to openings of the mask may be deposited on the substrate by aligning a substrate on which an emission layer is to be formed on a mask having a selectable pattern formed thereon and passing a material of emission layers through the openings of the mask.

In case that there is a defect in the mask, layers (patterns) deposited on the substrate may be formed differently than intended, resulting in product failure. In case that the mask has a large area, an etching error for pattern formation may increase, and sagging of a central portion thereof due to its own weight may increase. To ameliorate this problem, the mask may be divided into a stick shape and fixed to a frame, or fixed to the frame without being divided to be used.

The above information disclosed in this background section is only for enhancement of understanding of the background, and therefore, it may contain information that does not form the prior art that may already be known to a person of ordinary skill in the art.

SUMMARY

A deposition mask may be fixed to a frame through welding while being tensioned in both directions.

Openings of the mask may be deformed so that a width thereof increases in a direction in which the mask is tensioned, and the deformed shape may correspond to the shape of the layers to be deposited. In case that the openings of the mask are symmetrical with respect to the tension direction, the mask may not be distorted during tension, so pixel position accuracy (PPA) may not be distorted. However, if the openings of the mask are asymmetrical with respect to the tension direction, the PPA may be distorted because the mask is distorted during tension.

Embodiments provide a mask capable of reducing distortion in case that the mask is tensioned even in case that openings of the mask are asymmetrical.

A deposition mask according to an embodiment may include an opening area including an opening; a first dummy opening area disposed at a first side of the opening area in a first direction and having a first dummy opening, in the first dummy opening area; and a second dummy opening area disposed at a second side of the opening area in the first direction and having a second dummy opening, in the second dummy opening area. A first side and a second side of the opening are asymmetrical with respect to a second direction intersecting the first direction, and the first dummy opening and the second dummy opening are symmetrical with the opening with respect to the second direction.

The first dummy opening area and the second dummy opening area may be integral with the opening area.

The first dummy opening and the opening may overlap in plan view and substantially coincide in case that folding the first dummy opening area along a boundary line between the opening area and the first dummy opening area.

The second dummy opening and the opening may overlap in plan view and substantially coincide in case that folding the second dummy opening area along a boundary line between the opening area and the second dummy opening area.

A shape of the first dummy opening may be substantially identical a shape of the second dummy opening.

An extending direction of the opening may be inclined with respect to the second direction.

An extending direction of the opening may be inclined by a degrees with respect to the second direction, and an extending direction of the first dummy opening and the second dummy opening may be inclined by $-\alpha$ degrees with respect to the second direction.

The first dummy opening area and the second dummy opening area may partially offset distortion of the opening area in case that the deposition mask is tensioned from opposite sides in a direction parallel to the second direction.

The opening area may further include a substantially concave pattern that does not overlap the opening of the opening area in plan view.

An extending direction of the opening may be inclined by $\beta$ degrees with respect to the second direction, and an extending direction of the substantially concave pattern may be inclined by $-\beta$ degree with respect to the second direction.

The substantially concave pattern may extend in a direction intersecting the extending direction of the opening of the opening area.

The substantially concave pattern may have a larger area than an area of the opening of the opening area.

The opening area may include a boundary portion that surrounds the substantially concave pattern and is thicker than the substantially concave pattern.

The deposition mask may further include a blocking mask including an open area which overlaps the open area in plan view. The first dummy opening area and the second dummy opening area may be blocked by the blocking mask.

A deposition mask according to an embodiment may include an opening area including a first surface and a second surface facing each other, and including an opening; a substantially concave pattern disposed on the second surface and extending in a direction intersecting an extending direction of the opening; and a boundary portion disposed between the opening and the substantially concave pattern on the second surface and the boundary portion being thicker than the substantially concave pattern.

The substantially concave pattern may extend in a direction intersecting the extending direction of the opening of the opening area.

The extending direction of the opening and an extending direction of the substantially concave pattern may be substantially symmetrical.

The substantially concave pattern may have a larger area than an area of the opening of the opening area.

The substantially concave pattern may partially offset distortion of the opening area in case that the deposition mask is tensioned from opposite sides.

The boundary portion may surround the substantially concave pattern.

According to embodiments, even in case that the openings of the deposition mask are asymmetrical, distortion of the mask during tension may be reduced and pixel alignment accuracy (PPA) may be improved. Further, according to embodiments, there are other advantageous effects that can be recognized throughout the specification.

BRIEF DESCRIPTION OF THE DRAWINGS

The above and other aspects and features of the disclosure will become more apparent by describing in detail embodiments thereof with reference to the attached drawings, in which:

FIG. 3 illustrates a schematic plan view of a second display area of a display device according to an embodiment.

FIG. 5 illustrates a schematic top plan view of a region of a low adhesion layer mask in which openings are formed and a view showing a tensioned state of the low adhesion layer mask.

FIG. 13 illustrates a schematic top plan view of a deposition mask according to an embodiment.

DETAILED DESCRIPTION OF THE EMBODIMENTS

Figure 1:
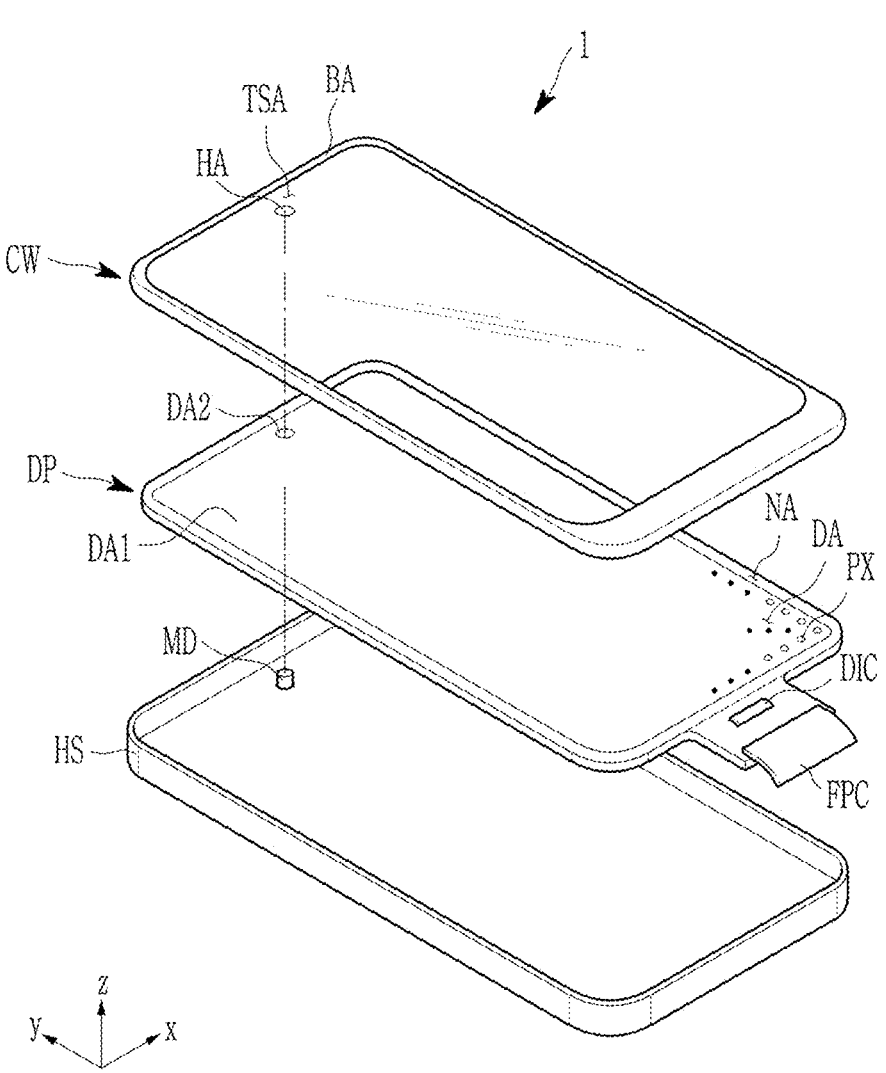
FIG. 1 illustrates a schematic exploded perspective view of a display device according to an embodiment.

This disclosure will be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the specification, "connected" means that two or more components are not only directly connected, but two or more components may be connected indirectly through other components, physically connected as well as being electrically connected, or it may be referred to be different names depending on the location or function, but may include connecting each of parts that are substantially integral to each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the drawings, symbols "x", "y", and "z" are used to indicate directions. Herein, x is used for indicating a first direction, y is used for indicating a second direction that is perpendicular to the first direction, and z is used for indicating a third direction that is perpendicular to the first direction and the second direction.

FIG. 1 illustrates a schematic exploded perspective view of a display device according to an embodiment.

Referring to FIG. 1, the display device 1 may be applied to electronic devices such as smart phones, mobile phones, tablets, multimedia players, notebooks, and game consoles. The display device 1 may be rigid. The display device 1 may include a flexible portion capable of bending, folding, rolling, and the like within the spirit and the scope of the disclosure. The display device 1 may display an image in the third direction z corresponding to the front on a plane defined by the first direction x and the second direction y. The display device 1 may include a display panel DP, a cover window CW, an electronic module MD, and a housing HS.

The display panel DP may include a display area DA and a non-display area NA. The display area DA, which is an area in which an image is displayed, may correspond to a screen. The non-display area NA, which is an area in which an image is not displayed, may surround or may be adjacent to at least a portion of the display area DA.

The display panel DP may include pixels PX arranged (or disposed) in the display area DA, and may display an image by a combination of the pixels PX. The display panel DP may include pixel circuits and signal lines for driving the pixels PX. The display panel DP may be a light emitting display panel including light emitting diodes, and each of the light emitting diodes may constitute a pixel PX. The display panel DP may include a touch sensor layer capable of sensing a touch.

The display area DA of the display panel DP may include a first display area DA1 and a second display area DA2. The second display area DA2 may have higher transmittance than the first display area DA1. Herein, the transmittance may indicate transmittance of light passing through the display panel DP in the third direction z. The light may be visible light and/or light having a wavelength other than visible light (for example, infrared light). The second display area DA2 may have a lower density of pixels PX, for example, a number of pixels PX per unit area, than the first display area DA1.

The second display area DA2 may be variously positioned in the display area DA. In the illustrated embodiment, the second display area DA2 is positioned within the first display area DA1 to be surrounded by the first display area DA1. The second display area DA2 may be positioned in contact with the non-display area NA. The second display area DA2 may be positioned at a center, left side and/or right side of an upper end of the display area DA. The second display area DA2 may be separated into two or more areas. The second display area DA2 be positioned across the upper end of the display area DA along a first direction x. The second display area DA2 may be positioned across a left end and/or a right end of the display area DA along a second direction y. The second display area DA2 can have various shapes such as a quadrangle, a triangle, a polygon, a circle, an ellipse, and so on. It is to be understood that the shapes disclosed herein may also include shapes substantial to the shapes disclosed herein.

The display panel DP may include a touch sensing area capable of detecting a touch, and the touch sensing area may substantially coincide with the display area DA. Touch electrodes may be arranged in the touch sensing area, and the touch electrodes may sense a user contact or non-contact touch. The touch electrodes may sense a touch by using a self-capacitor method or a touch by using a mutual capacitor method. The display panel DP may be referred to as a touch screen panel. The display device 1 may generate signals for driving the touch electrodes, and may include a touch driver that processes the signals received from the touch electrodes, and the touch driver may be provided as an integrated circuit chip.

A driver generating and/or processing various signals for driving the pixels PX may be positioned in the non-display area NA of the display panel DP. For example, the driver may include a data driver DIC for applying a data voltage to the pixels PX, a gate driver for applying a gate signal to the pixels PX, and a controller for controlling the data driver DIC and the gate driver. A gate driver may be integrated in the non-display area NA. The data driver DIC may be provided in the form of an integrated circuit chip to be mounted in the non-display area NA. The data driver DIC, the touch driver, and/or the controller may be positioned on a flexible printed circuit film (FPC) to be electrically connected to the display panel DP.

The cover window CW may be positioned on the display panel DP to protect the display panel DP from external impact, for example, and may transmit an image displayed on the display panel DP. The cover window CW may be attached to the display panel DP by an adhesive such as an optically clear adhesive (OCA) or an optically clear resin (OCR). The cover window CW may be coated on the display panel DP. The cover window CW may include a transmission area TSA and a blocking area BA. The transmission area TSA, which is an optically transparent area, may transmit incident light. The blocking area BA may have lower light transmittance than that of the transmission area TSA. A blocking area BA defines a shape of the transmission area TSA. The blocking area BA may surround the transmission area transmission area. The blocking area BA may show a selectable color. The blocking area BA may overlap the non-display area NA of the display panel DP to block the non-display area NA from being viewed from the outside.

The cover window CW may include a hole area HA. The hole area HA may overlap the electronic module MD. The electronic module MD may operate by receiving external signals provided through the hole area HA. The hole area HA may be positioned in the transmission area TSA. A selectable portion recessed from a rear surface of the cover window CW may be defined in the hole area HA. The recessed portion may have a groove having a lower depth than a thickness of the cover window CW. The hole area HA may overlap the second display area DA2 of the display panel DP. A position and number of hole areas may be variously changed.

The electronic module MD may include various functional modules related to an operation of the display device 1. The electronic module MD may be electrically connected to the display panel DP through a connector or the like within the spirit and the scope of the disclosure. The electronic module MD may include a light emitting module, a light sensing module, and/or a photographing module. For example, the electronic module MD may be a camera module, and may photograph a subject received through the hole area HA and the second display area DA2.

The housing HS may be coupled to or connected to the cover window CW to constitute an exterior of the display device 1. The housing HS may be made of a material having high rigidity such as metal, glass, or plastic. The display panel DP and the electronic module MD may be positioned in an internal space of the display device 1 defined by the cover window CW and the housing HS.

Figure 2:
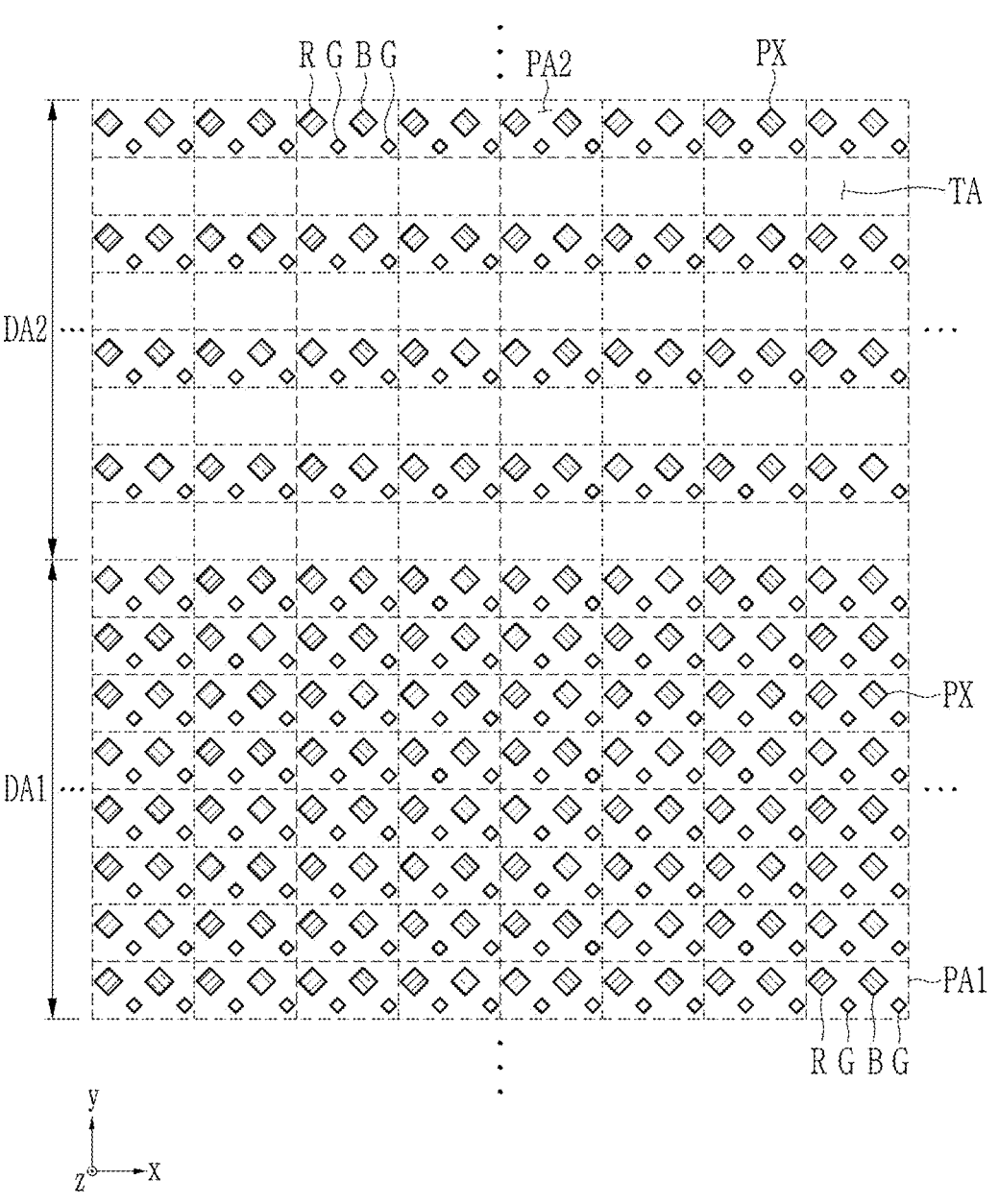
FIG. 2 illustrates a schematic plan view of a display area of a display panel according to an embodiment.

FIG. 2 illustrates a schematic plan view of a display area of a display panel according to an embodiment.

Referring to FIG. 2, the first display area DA1 may include first pixel areas PA1, and the second display area DA2 may include second pixel areas PA2 and transmission areas TA. A size of one first pixel area PA1 and a size of one second pixel area PA2 may be the same or different.

In the first display area DA1, the first pixel areas PA1 may be arranged in a matrix form in the first direction x and the second direction y. In the second display area DA2, the second pixel areas PA2 and the transmission areas TA may be arranged in a matrix form. One or more second pixel areas PA2 and one or more transmission areas TA may be alternately arranged in the first direction (x and/or the second direction y. In the illustrated embodiment, the second pixel areas PA2 and the transmission areas TA are alternately arranged along the second direction y, but disposals of the second pixel areas PA2 and the transmission areas TA may be variously changed. For example, the second pixel areas PA2 and the transmission areas TA may be arranged in a checkerboard pattern. As another example, the transmission areas TA are arranged to surround the second pixel area PA2, or the transmission areas TA may be arranged to surround one second pixel area PA2.

A size of one second pixel area PA2 and a size of one transmission area TA may be substantially the same or different. Sizes of the transmission areas TA may be substantially the same or different. The sizes of the second pixel areas PA2 and the transmission areas TA may be variously changed. For example, in the illustrated embodiment, although an area ratio of the second pixel area PA2 to the transmission area TA is approximately 1:1, various area ratios such as approximately 1:3, 1:7, and 1:15 may be provided. The area ratio of the second pixel area PA2 to the transmission area TA may be about 1:2(n−1) (where n is a natural number). A pixel density and transmittance of the second display area DA2 may be changed according to the area ratio of the second pixel area PA2 to the transmission area TA. The pixel density and transmittance may have a trade-off relationship.

The first pixel area PA1 and the second pixel area PA2 may each include one or more pixels PX. The pixel PX may include a pixel circuit and an emission portion. The pixel circuit is a circuit for driving a light emitting element such as a light emitting diode (LED) or an organic light emitting diode (OLED), and may include a transistor, a capacitor, and the like within the spirit and the scope of the disclosure. The emission portion is a region in which light emitted from a light emitting element is outputted. The pixel PX illustrated in FIG. 2 may correspond to the emission portion. The emission portion may have a substantially rhombic shape, but may have various shapes such as a rectangular shape and a circular shape. The pixels PX may emit light in one direction, or in a direction, for example, in the third direction z.

The transmission area TA may not include the pixel circuit and the emission portion. Pixel circuits, emission portions, for example, which block the transmission of light, may not or almost not be positioned in the transmission area TA, transmittance may be higher than that of the first and second pixel areas PA1 and PA2.

In the illustrated embodiment, each of the first pixel areas PA1 may include one red pixel R, two green pixels G, and one blue pixel B. Each of the second pixel areas PA2 may include one red pixel R, two green pixels G, and one blue pixel B. Unlike what is illustrated, a pixel disposal of the first pixel area PA1 may be different from that of the second pixel area PA2. In case that a set of pixels R, G, and B included in each of the pixel areas PA1, and PA2 is referred to as a unit pixel, a configuration of the unit pixel of the first pixel area PA1 and the configuration of the unit pixel of the second pixel area PA2 may be the same or different. The unit pixel may include one red pixel R, one green pixel G, and one blue pixel B. The unit pixel may include at least one of the red pixel R, the green pixel G, and the blue pixel B, and may also include a white pixel.

The pixels R, G, and B included in the first display area DA1 constitute a pixel row in the first direction x. The pixels R, G, and B included in the second display area DA2 also constitute a pixel row in the first direction x.

In each pixel row in the first display area DA1, the pixels R, G, and B may be arranged in a zigzag pattern or substantially in a line in the first direction x. In each pixel row, the pixels R, G and B may be repeatedly arranged in an order of the red pixel R, the green pixel G, the blue pixel B, and the green pixel G in the first direction x. A disposal of the pixels R, G, and B included in one pixel row may be changed in various ways. For example, the pixels R, G, and B may be repeatedly arranged in an order of the blue pixel B, the green pixel G, the red pixel R, and the green pixel G in the first direction x, or may be repeatedly arranged in an order of the red pixel R, the blue pixel B, the green pixel G, and the blue pixel B.

In each pixel row in the second display area DA2, the pixels R, G, and B may be arranged in a zigzag pattern or substantially in a line in the first direction x. In each pixel row, the pixels R, G and B may be repeatedly arranged in an order of the red pixel R, the green pixel G, the blue pixel B, and the green pixel G in the first direction x. A disposal of the pixels R, G, and B included in one pixel row may be changed in various ways.

The pixels R, G and B of the first and second pixel areas PA1 and PA2 also constitute a pixel column in the second direction y. In each pixel column, the pixels R, G, and B are substantially arranged in a line in the second direction y. Pixels PX of a same color may be arranged in each pixel column, and pixels PX of two or more colors may be alternately arranged in the second direction y. A disposal of the pixels R, G, and B included in one pixel row may be changed in various ways.

Figure 3:
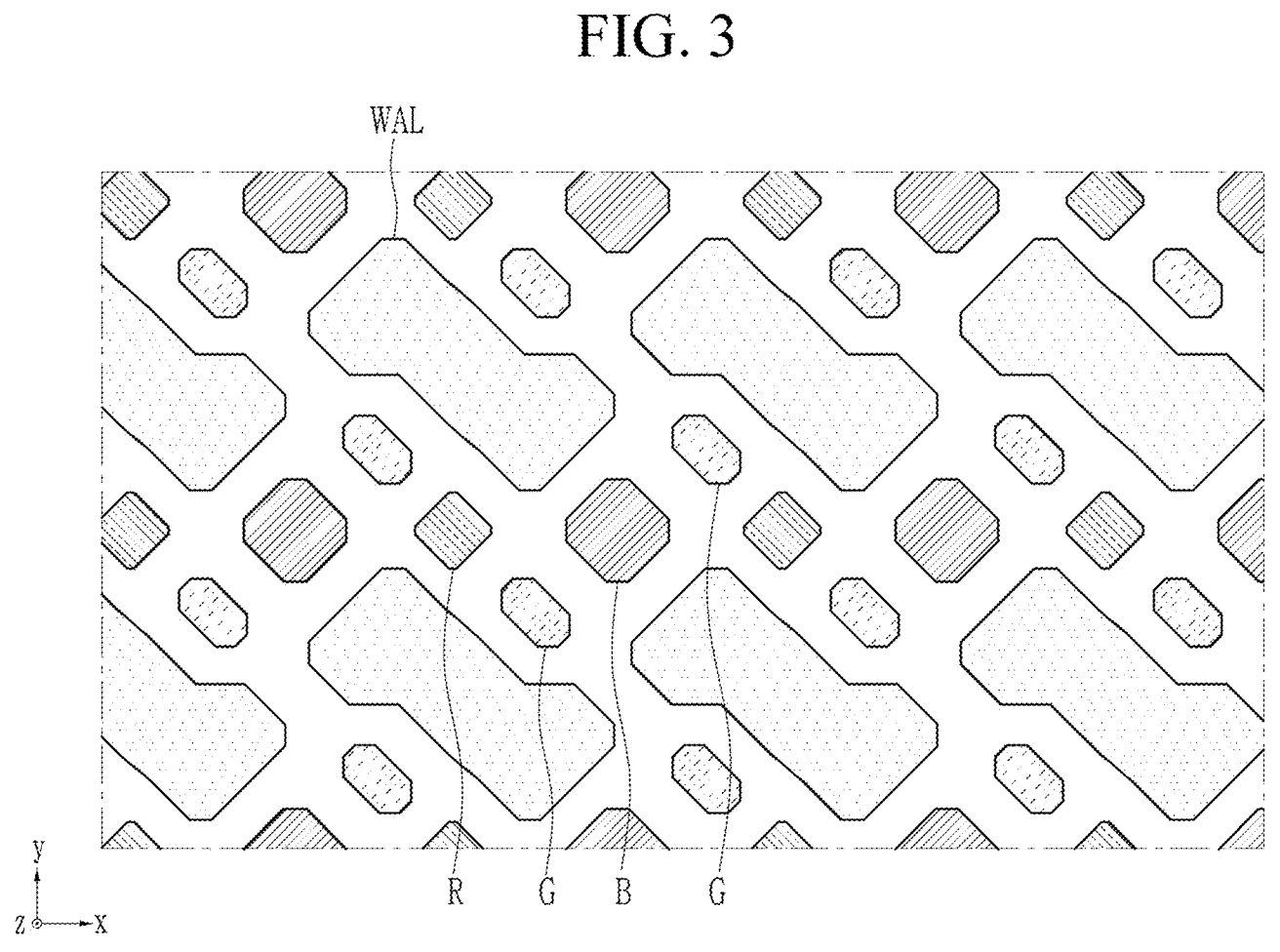
Figure 4:
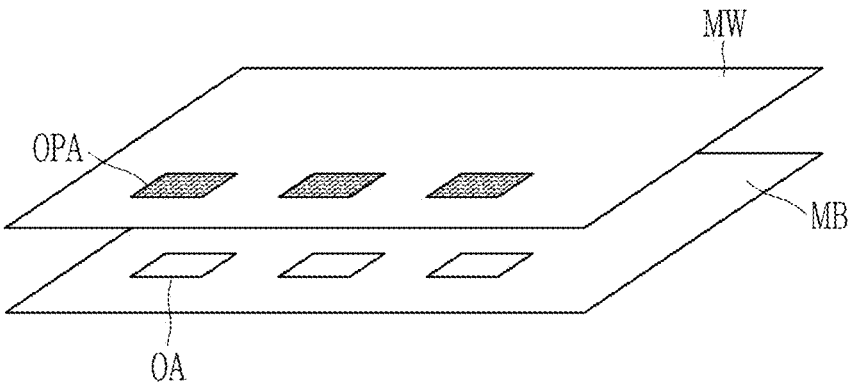
FIG. 4 illustrates a schematic view showing a deposition mask according to an embodiment.

FIG. 3 illustrates a schematic plan view of a second display area of a display device according to an embodiment. FIG. 4 illustrates a schematic view showing a deposition mask according to an embodiment.

Referring to FIG. 3, a planar shape of a low adhesion layer WAL together with the pixels R, G, and B positioned in the second display area DA2 is illustrated. The low adhesion layer WAL may be a layer formed to increase transmittance of the second display area DA2. The low adhesion layer WAL may prevent or reduce transmittance degradation due to a cathode of a light emitting element by preventing the cathode from being deposited thereon. It is advantageous to increase the transmittance in case that the cathode is not positioned in an area other than an area where the pixels R, G, and B are positioned in the second display area DA2, and thus it may be advantageous to form the low adhesion layer WAL as wide as possible. The weak adhesion layer WAL may have a shape in which left and right sides are asymmetric (for example, a shape asymmetric with respect to the second direction y) depending on shapes and disposals of the pixels R, G, and B. The low adhesion layer WAL may generally have a shape inclined with respect to the first direction x and/or the second direction y.

Referring to FIG. 4, a deposition mask for forming the low adhesion layer WAL may include a low adhesion layer mask MW and a blocking mask MB. The low adhesion layer mask MW may include an opening area OPA corresponding to the second display area DA2, and openings formed in a pattern corresponding to the low adhesion layer WAL of the second display area DA2 may be positioned in the opening area OPA. A material evaporated from a deposition source of a deposition device and passing through openings of the low adhesion layer mask MW is deposited on a target substrate to form the low adhesion layer WAL. An area of the low adhesion layer mask MW except for an area corresponding to the second display area DA2 may be blocked. The blocking mask MB may be an open mask in which an area corresponding to a second display area DA2 is open, and the remaining area is blocked. The open area OA of the blocking mask MB may overlap the openings of the low adhesion layer mask MW.

Although the low adhesion layer mask MW and the blocking mask MB are illustrated apart, they may be in close contact with each other, and may be fixed to a frame. In case that the deposition mask is used, the blocking mask MB may be positioned to face the deposition source, and the low adhesion layer mask MW may be positioned to face the target substrate. The low adhesion layer mask MW may be formed in a size corresponding to a mother substrate or divided into a size corresponding to one or more display panels (for example, a stick shape).

Figure 5:
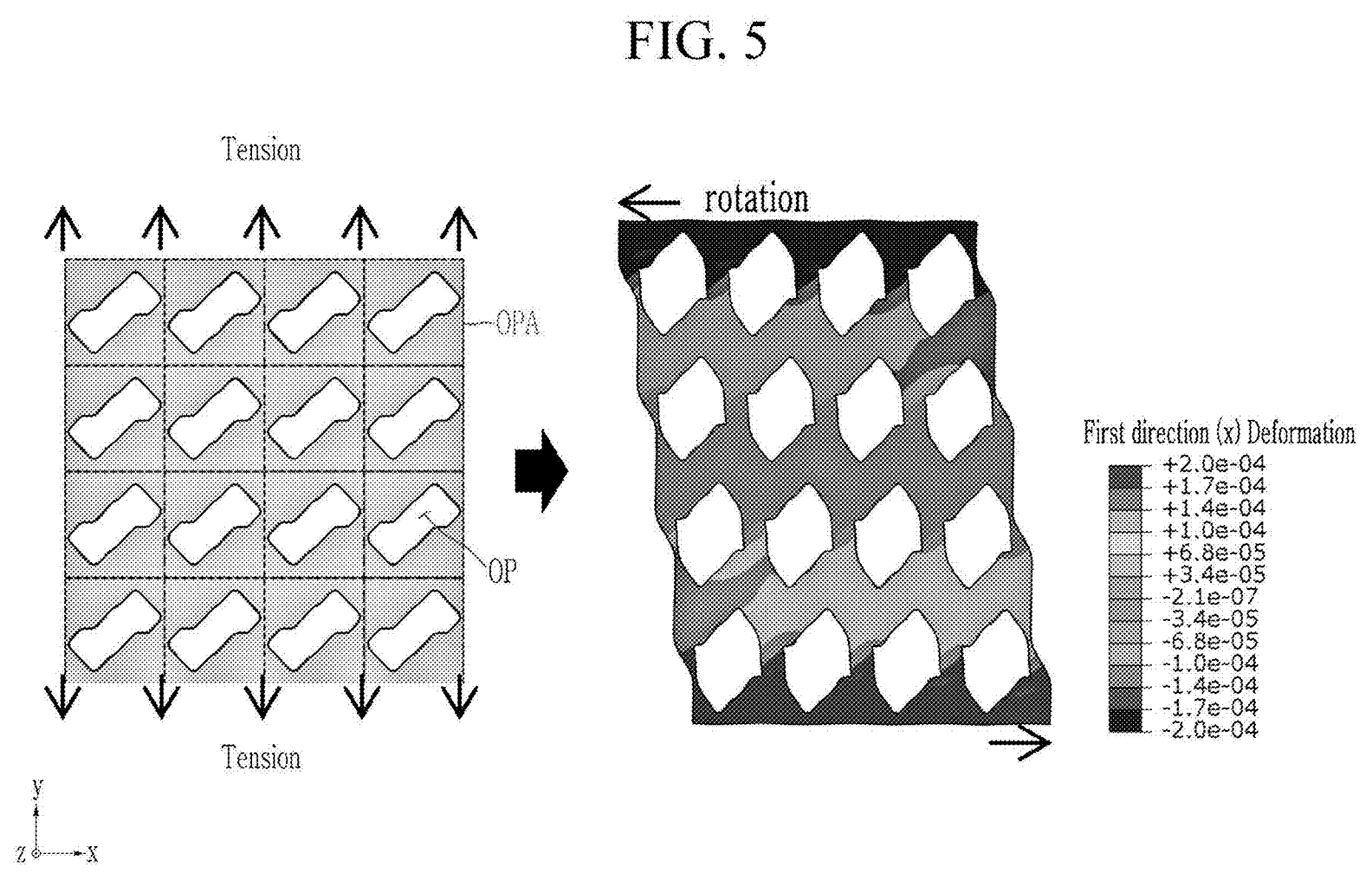

FIG. 5 illustrates a schematic top plan view of a region of a low adhesion layer mask in which openings are formed and a view showing a tensioned state of the low adhesion layer mask.

Referring to FIG. 5, the low adhesion layer mask MW (hereinafter, simply referred to as a mask) may be formed in an opening area OPA, and may include an opening OP corresponding to the low adhesion layer WAL illustrated in FIG. 3. The mask MW may be fixed to a frame (not illustrated) while tensioned from opposite sides in a direction that is parallel to the second direction y. In case that the mask MW is tensioned, as illustrated in a right drawing of FIG. 5, the mask MW may be distorted while rotating in a counterclockwise direction due to the asymmetrical shape of the opening OP. The drawing at the right side of FIG. 5 shows distortion of the mask MW during tension, and a lot of deformation in the first direction x may occur in an edge region in the tension direction. Accordingly, the PPA may be distorted, and the low adhesion layer WAL may not be accurately deposited at a designed position.

Figure 6:
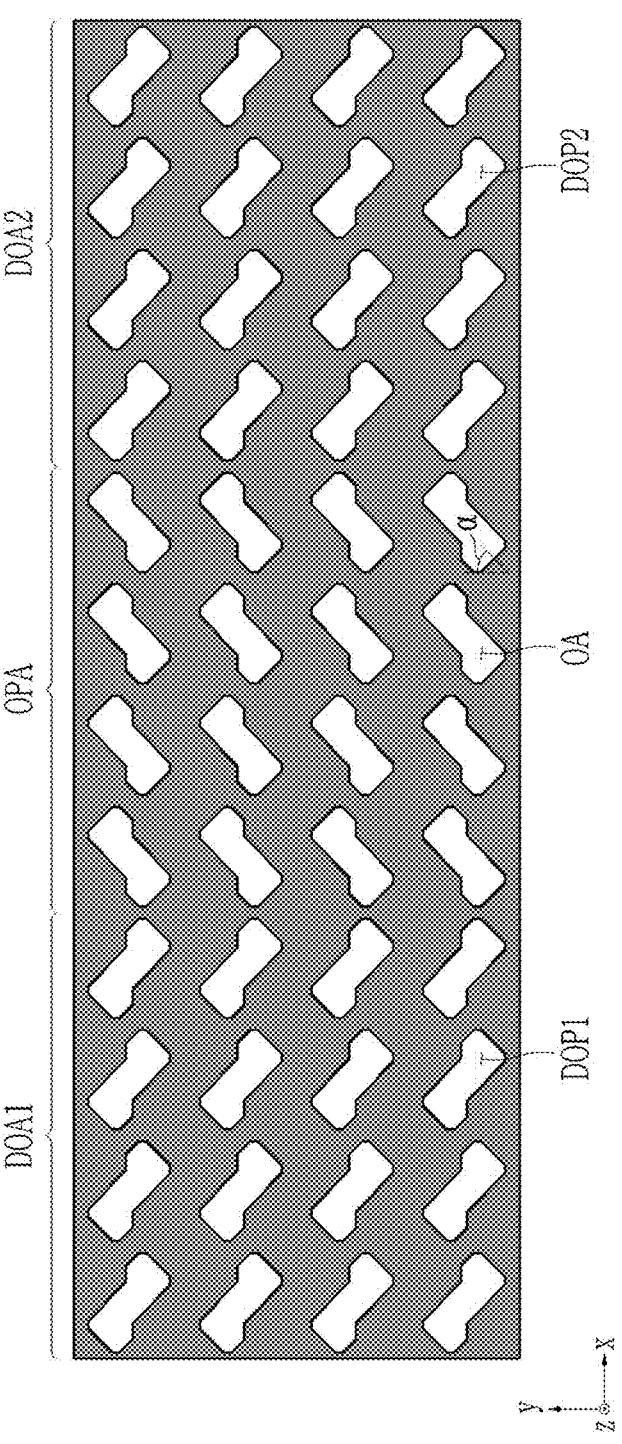
FIG. 6 illustrates a schematic top plan view of a low adhesion layer mask according to an embodiment.
Figure 7:
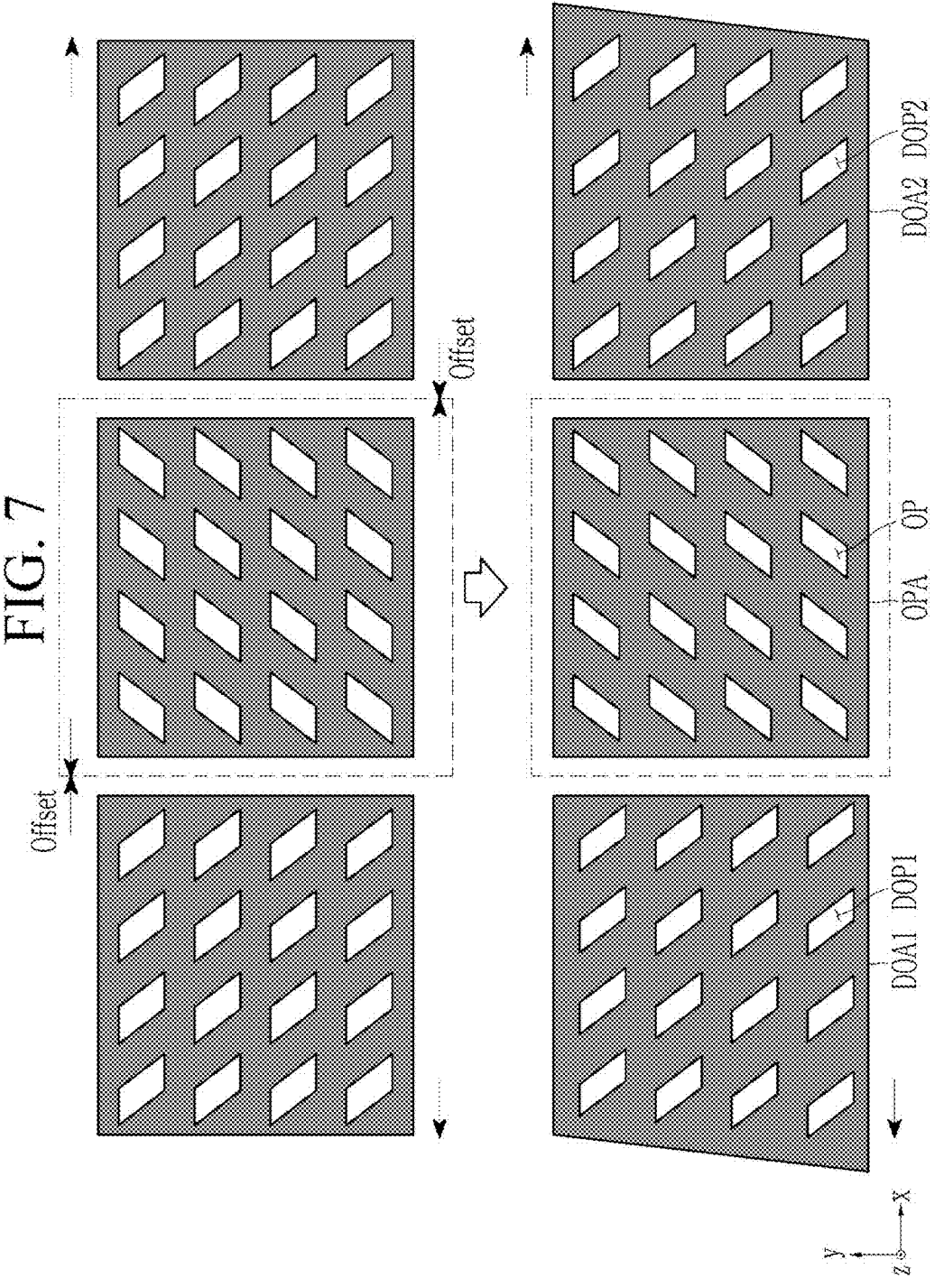
FIG. 7 illustrates a schematic view showing distortion of a low adhesion layer mask during tension according to an embodiment.
Figure 8:
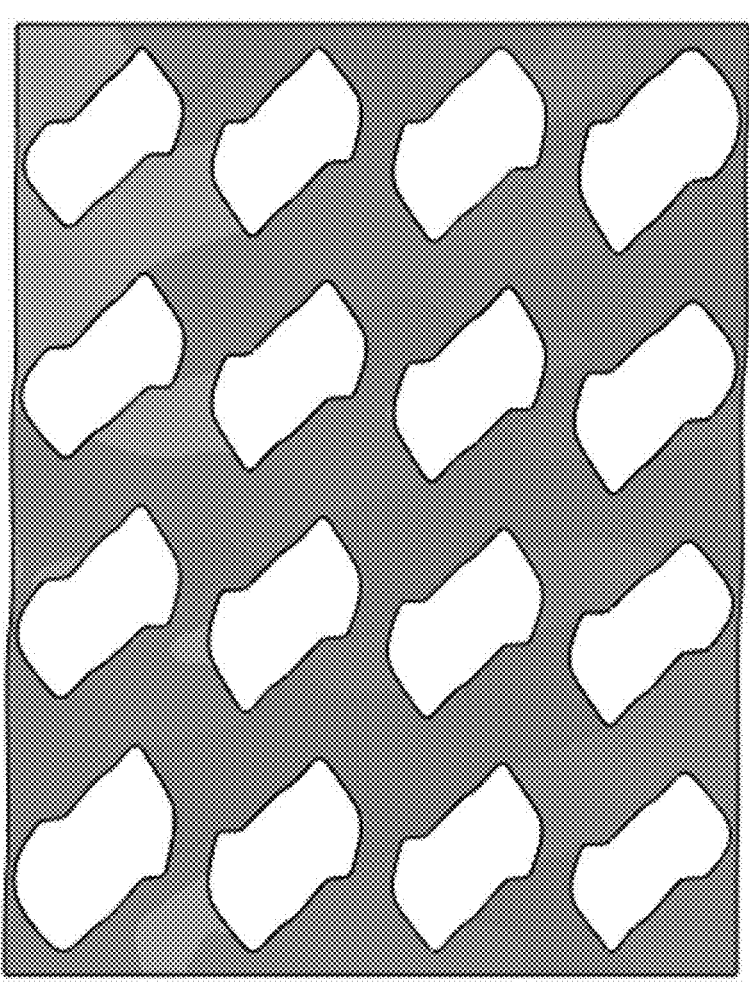
FIG. 8 illustrates a tensioned state of a low adhesion layer mask according to an embodiment.

FIG. 6 illustrates a schematic top plan view of a low adhesion layer mask according to an embodiment, FIG. 7 illustrates a schematic view showing distortion of a low adhesion layer mask during tension according to an embodiment, and FIG. 8 illustrates a view showing a tensioned state of a low adhesion layer mask according to an embodiment.

Referring to FIG. 6, the low adhesion layer mask MW may include an opening area OPA, and a first dummy opening area DOA1 and a second dummy opening area DOA2 positioned at opposite of the opening area OPA. The first dummy opening area DOA1 and the second dummy opening area DOA2 may be adjacent to the opening area OPA in the first direction x. The first dummy opening area DOA1 and the second dummy opening area DOA2 may be integral with the opening area OPA. The first and second dummy opening areas DOA1 may be provided to ameliorate distortion of the opening area OPA in case that the mask MW is tensioned.

The opening area OPA has openings OP corresponding to the low adhesive layer WAL, and may correspond to the opening area OPA described with reference to FIG. 5. First dummy openings DOP1 are formed in the first dummy opening area DOA1, and second dummy openings DOP2 are formed in the second dummy opening area DOA2. The first dummy opening DOP1 and the second dummy opening DOP2 may be formed to extend in a direction intersecting a direction in which the opening OP extends. Herein, the extending direction (or extending direction) may correspond to a direction of a line connecting two points farthest from the opening OP or the second dummy openings DOP1 and DOP2.

The first and second dummy openings DOP1 and DOP2 may be formed symmetrically with the openings OP in the second direction y. For example, in case that the first dummy opening area DOA1 is folded along a boundary line between the opening area OPA and the first dummy opening area DOA1, the first dummy openings DOP1 and the openings OP may substantially coincide and overlap each other. For example, the first dummy openings DOP1 and the openings OP may be mirror symmetrical. Similarly, in case that the second dummy opening area DOA2 is folded along a boundary line between the opening area OPA and the second dummy opening area DOA2, the second dummy openings DOP2 and the openings OP may substantially coincide and overlap each other. For example, the second dummy openings DOP2 and the openings OP may be mirror symmetrical. In case that the first dummy opening area DOA1 is parallelly moved to overlap the second dummy opening area DOA2, the first dummy openings DOP1 and the second dummy openings DOP2 may substantially coincide and overlap each other. Herein, substantially coinciding may include not only being congruent, but also having a same or similar overall shape.

A number of first dummy openings DOP1 may be the same as or different from that of openings OP. A number of second dummy openings DOP2 may be the same as or different from that of openings OP. The number of first dummy openings DOP1 may be the same as or different from that of second dummy openings DOP2. The first and second dummy openings DOP1 and DOP2 may be completely symmetrical with the opening OP as illustrated but only directions of the openings may be symmetrical, and shapes thereof may be different. For example, the opening OP may have a first shape (for example, an octagonal shape) in which an extending direction is inclined by about α degrees (for example, a may be in a range of about 1 to about 179) with respect to the second direction y, and the first and second dummy openings DOP1 and DOP2 may have a second shape (for example, a quadrangular shape) in which an extending direction is inclined by about –α degrees with respect to the second direction y.

The first and second dummy opening areas DOA1 and DOA2 may be blocked by the blocking mask MB. For example, only the open area OPA of the mask MW may overlap the open area OA of the blocking mask MB, and the first and second dummy opening areas DOA1 and DOA2 may not overlap the open area OA of the blocking mask MB. Accordingly, even in case that the first and second dummy opening areas DOA1 and DOA2 are adjacent to each other at opposite sides of the opening area OPA, no deposition material is deposited through the first and second dummy openings DOP1 and DOP2.

Referring to FIG. 7, the opening area OPA and the first and second dummy opening areas DOA1 and DOA2 are separately illustrated in order to clearly describe the distortion of the opening area OPA and the first and second dummy opening areas DOA1 and DOA2 in case that the mask MW is tensioned. In case that the mask MW is tensioned from opposite sides in a direction parallel to the second direction y, an upper end of the opening area OPA may be distorted in a direction –x opposite to the first direction x due to a rightwardly inclined shape of the openings OP, and a lower end thereof may be distorted in the first direction x. An upper end of the first dummy opening area DOA1 may be distorted in the first direction x due to a leftwardly inclined shape of the first dummy openings DOP1, and a lower end thereof may be distorted in the first direction x and the opposite direction –x. An upper end of the first dummy opening area DOA1 may be distorted in the first direction x due to a leftwardly inclined shape of the first dummy openings DOP1, and a lower end thereof may be distorted in the first direction x and the opposite direction –x.

As such, the first and second dummy opening areas DOA1 and DOA2 tend to be distorted in an opposite direction to the opening area OPA, and thus the distortion of the opening area OPA may be partially offset by the displacement of the first and second dummy opening areas DOA1 and DOA2, thereby ameliorating the distortion. FIG. 8 illustrates a tensioned state of the open area OPA in case that the mask MW illustrated in FIG. 6 is tensioned. Comparing with the right drawing of FIG. 5, it can be seen that the distortion is significantly ameliorated. Depending on simulation, the distortion of the mask MW illustrated in FIG. 5 is –0.014, and the distortion of the mask MW illustrated in FIG. 6 is about 0.002. Accordingly, it can be seen that the distortion of the opening area OPA is ameliorated by about 86.4% by forming dummy openings DOP1 and DOP2 symmetrical to the openings OP at opposite sides of the opening area OPA.

Although the mask MW for depositing the low adhesion layer WAL has been described as an example, characteristics of the mask MW described above may be applied to all deposition masks to which first and second dummy opening areas DOA1 and DOA2 may be applied to opposite sides of the opening area OPA to compensate for distortion.

Figure 9:
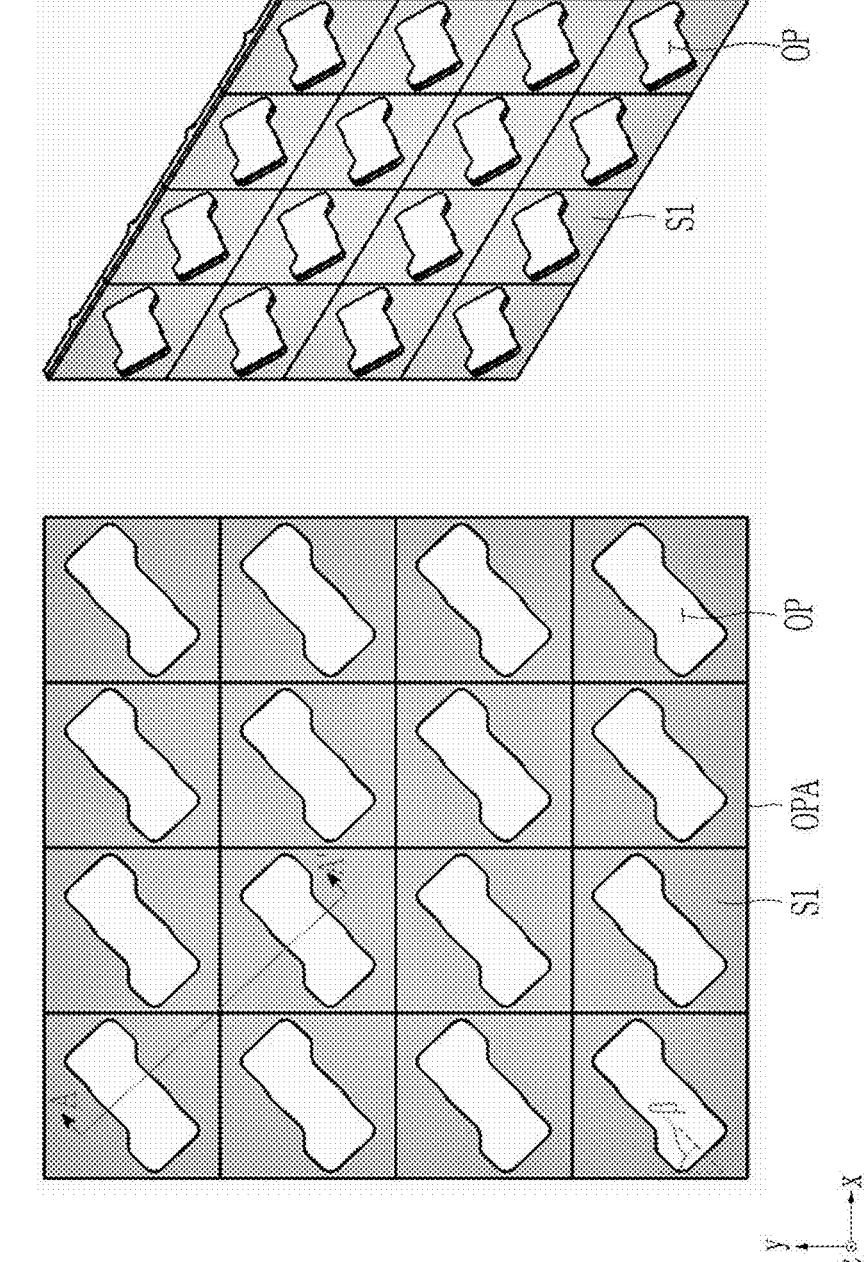
FIG. 9 illustrates a schematic top plan view and a perspective view showing a first surface of a deposition mask according to an embodiment.
Figure 10:
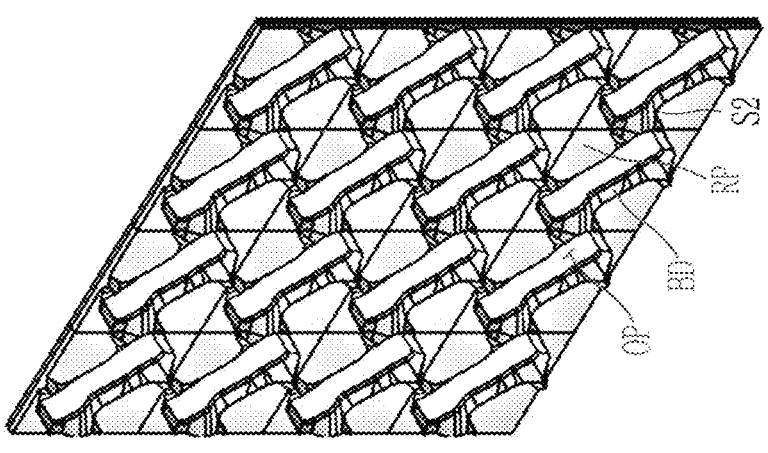
FIG. 10 illustrates a rear view and a perspective view showing a second surface of a deposition mask according to an embodiment.
Figure 10:
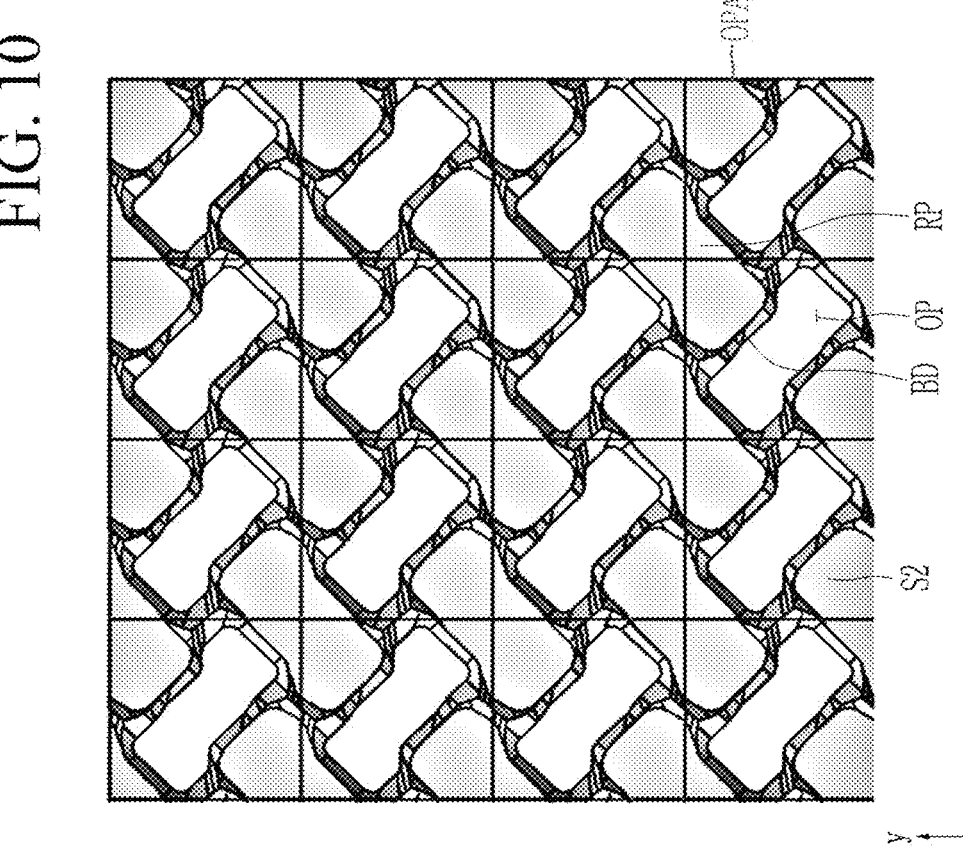
Figure 11:
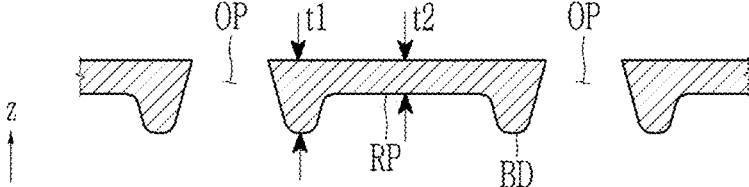
FIG. 11 illustrates a schematic cross-sectional view taken along line A-A' of FIG. 9.
Figure 12:
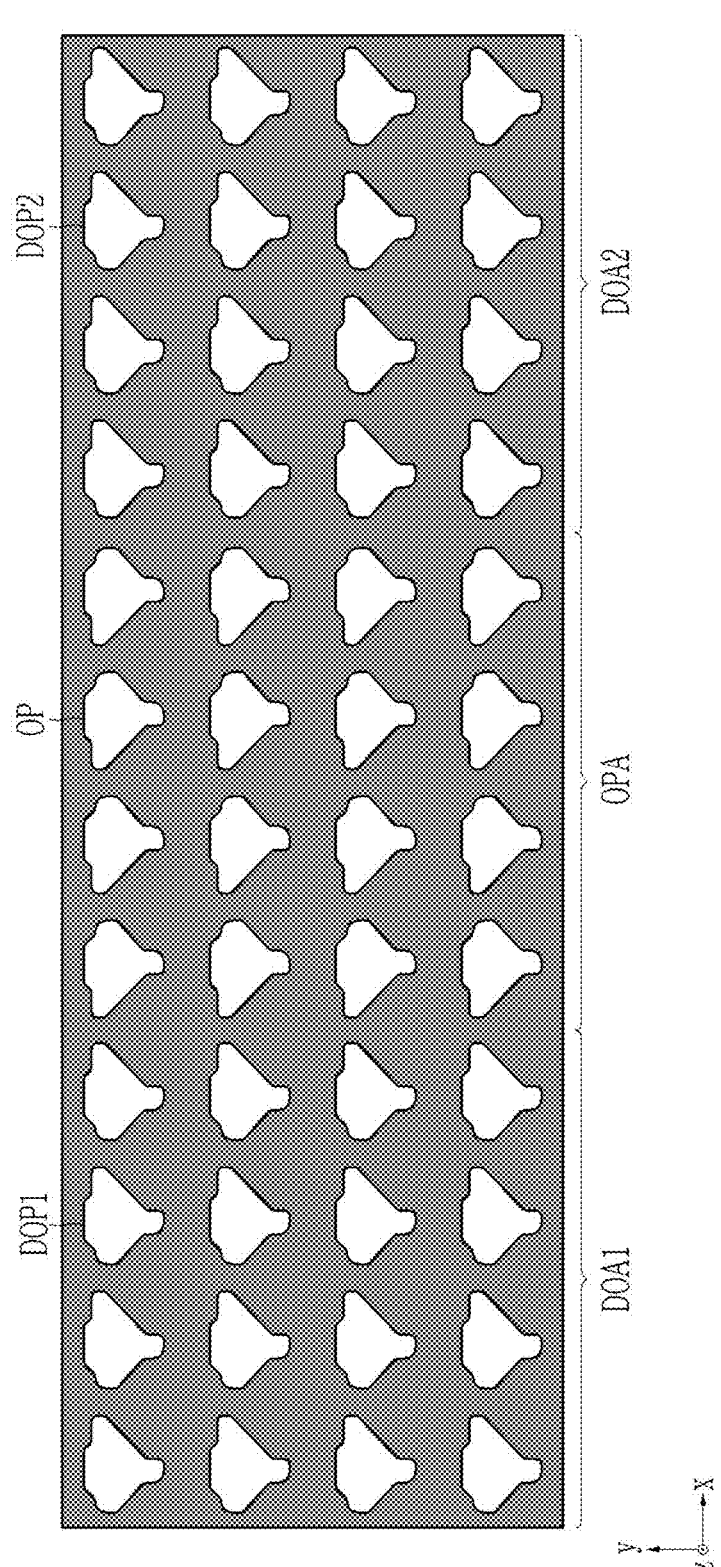
FIG. 12 illustrates a tensioned state of a deposition mask according to an embodiment.

FIG. 9 illustrates a schematic top plan view and a perspective view showing a first surface of a deposition mask according to an embodiment, FIG. 10 illustrates a rear view and a perspective view showing a second surface of a deposition mask according to an embodiment, and FIG. 11 illustrates a schematic cross-sectional view taken along line A-A' of FIG. 10. FIG. 12 illustrates a tensioned state of a deposition mask according to an embodiment. The deposition mask illustrated in these drawings may be the aforementioned low adhesion layer mask MW, or may be a mask for depositing another layer or pattern.

A first surface S1 illustrated in FIG. 9 is a surface facing a target substrate during deposition, and a second surface S2 illustrated in FIG. 10 is a surface facing a deposition source during deposition. Referring to FIG. 9, FIG. 10, and FIG. 11, the deposition mask may include openings OP that are asymmetrical with respect to the second direction y, which is a direction parallel to the tension direction. The first surface S1 of the mask may have a smooth surface because it may be advantageous for film formation quality to be in close contact with the target substrate as much as possible.

A concave pattern RP may be formed on the second surface S2 of the mask. The concave pattern RP may be positioned in an area where the openings OP are not positioned. For example, the concave pattern RP may be formed between the openings OP so as to not overlap the openings OP. Unlike the opening OP penetrating the mask, the concave pattern RP does not penetrate the mask. In case that the concave pattern RP is moved in parallel in the first direction x and the second direction y, it may be symmetrical with the opening OP. The concave pattern RP may be formed to extend in a direction intersecting a direction in which the openings OP extend. For example, in case that the extending direction of the openings OP is inclined by about β degrees (for example, β may be in a range of about 1 to about 179) with respect to the second direction y, an extending direction of the concave pattern RP may be inclined by about –β degrees.

In case that the mask is tensioned from opposite sides in a direction parallel to the second direction y, an upper end of the opening area OPA may be distorted in a direction –x opposite to the first direction x due to a rightwardly inclined shape of the openings OP, and a lower end thereof may be distorted in the first direction x. An upper end of concave patterns RP may be distorted in the first direction x, and a lower end thereof may be distorted in the first direction x and the opposite direction –x due to a leftwardly inclined shape thereof. As such, the concave patterns RP may prevent (for example, partially cancel) the distortion of the opening area OPA by the openings OP, thereby mitigating a degree of distortion. FIG. 12 illustrates a tensioned state of the opening area OPA in case that the mask illustrated in FIG. 10 and FIG. 11 is tensioned. Depending on the simulation, the mask illustrated in FIG. 10 and FIG. 11 showed distortion of about 0.013, which indicates that the distortion is ameliorated by about 8.7% compared to the mask illustrated in FIG. 5.

A boundary portion BD may be positioned between the opening OP and the concave pattern RP due to formation of the concave pattern RP. The boundary portion BD may surround the concave pattern RP and the opening OP. A thickness t1 of the boundary portion BD may be greater than a thickness t2 of the concave pattern RP. The thickness t1 of the boundary portion BD in the opening area OPA may be the greatest. The concave pattern RP may be formed to a depth corresponding to t1-t2 from the boundary portion BD. The thickness t2 of the concave pattern RP may be less than about ¾, less than about ½, or less than about ⅓ of the thickness t1 of the boundary portion BD. The thickness t2 of the concave pattern RP may be advantageous in ameliorating distortion of the mask in case that the thickness t2 of the mask is as thin as possible so as to not rupture in case that the mask is tensioned or used. The concave pattern RP may be formed by, for example, a half-etching process.

Since the concave pattern RP does not penetrate the mask MW unlike the opening OP, it may be advantageous to ameliorate distortion of the mask MW in case that the concave pattern RP has a larger area than that of the opening OP. For example, the area of the concave pattern RP may be about 1.2 times or more, about 1.5 times or more, or about 1.8 times or more of the area of the opening OP.

Figure 13:
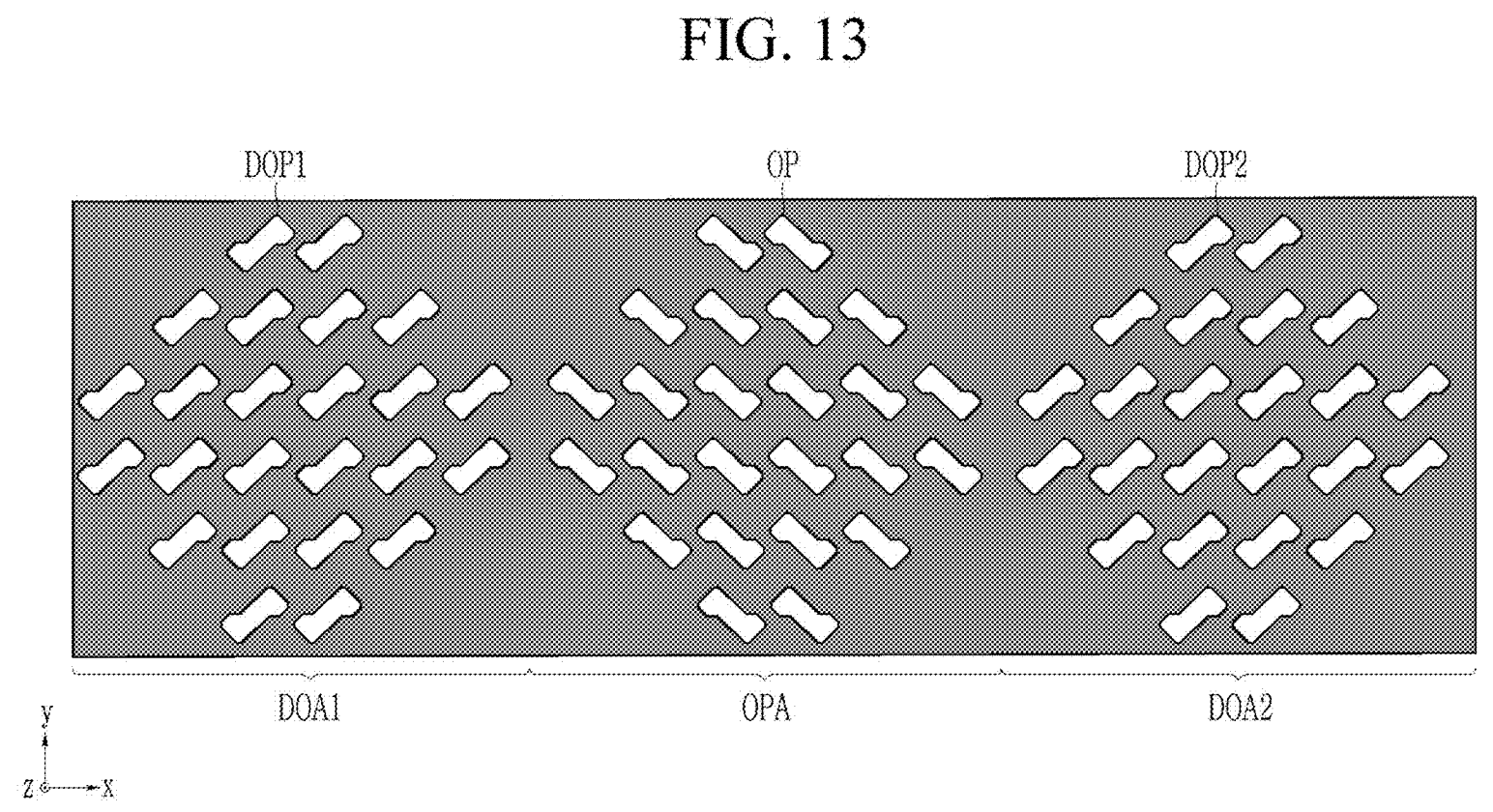

FIG. 13 illustrates a schematic top plan view of a deposition mask according to an embodiment.

The deposition mask illustrated in FIG. 13 may be the aforementioned low adhesion layer mask MW, or may be a mask for depositing other layers or patterns. The mask may include an opening area OPA in which openings OP are formed. The mask may include a first dummy opening area DOA1 in which the first dummy openings DOP1 are formed on a first side and a second side of the opening area OPA, and a second dummy opening area DOA2 in which the second dummy openings DOP2 are formed. The first and second dummy openings DOP1 and DOP2 are formed symmetrically with the openings OP with respect to the second direction y parallel to the extending direction of the deposition mask. Unlike an embodiment illustrated in FIG. 6, the openings OP are generally arranged in a rhombic shape, and the first and second dummy openings DOP1 and DOP2 are also generally arranged in a diamond shape. Even in case that an overall disposal of the openings OP is different, in case that the dummy openings DOP1 and DOP2 are formed symmetrically with the openings OP, distortion of the opening area OPA in case that the mask is tensioned may be improved, and PPA may be improved accordingly.

Distortion during tension was found to be about 0.001 in the mask in which the concave pattern RP illustrated in FIG. 10 is applied to a second surface of the opening area OPA of the mask illustrated in FIG. 13. The distortion during tension was about 0.017 in the mask having the opening area OPA of the mask illustrated in FIG. 13 (including no dummy opening area). Comparing two results, the distortion is ameliorated by about 95.5% in a corrected structure to which a dummy aperture area and a concave pattern are applied.

Figure 14:
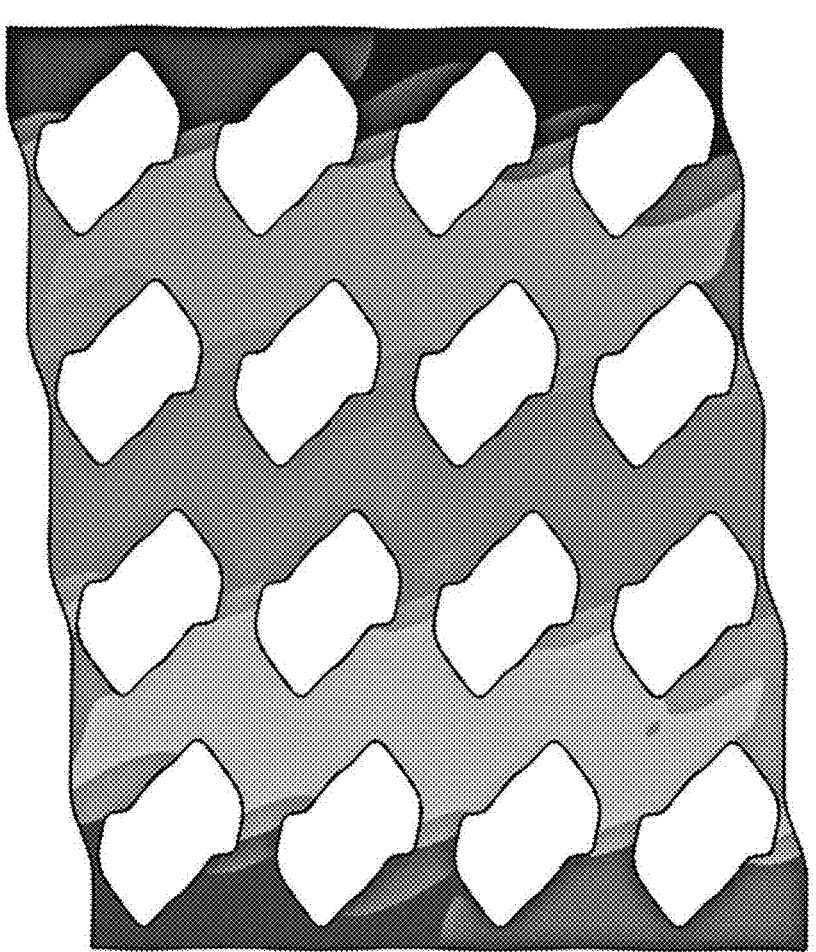
FIG. 14, FIG. 15, and FIG. 16 each illustrate a schematic top plan view of a deposition mask according to an embodiment.
Figure 15:
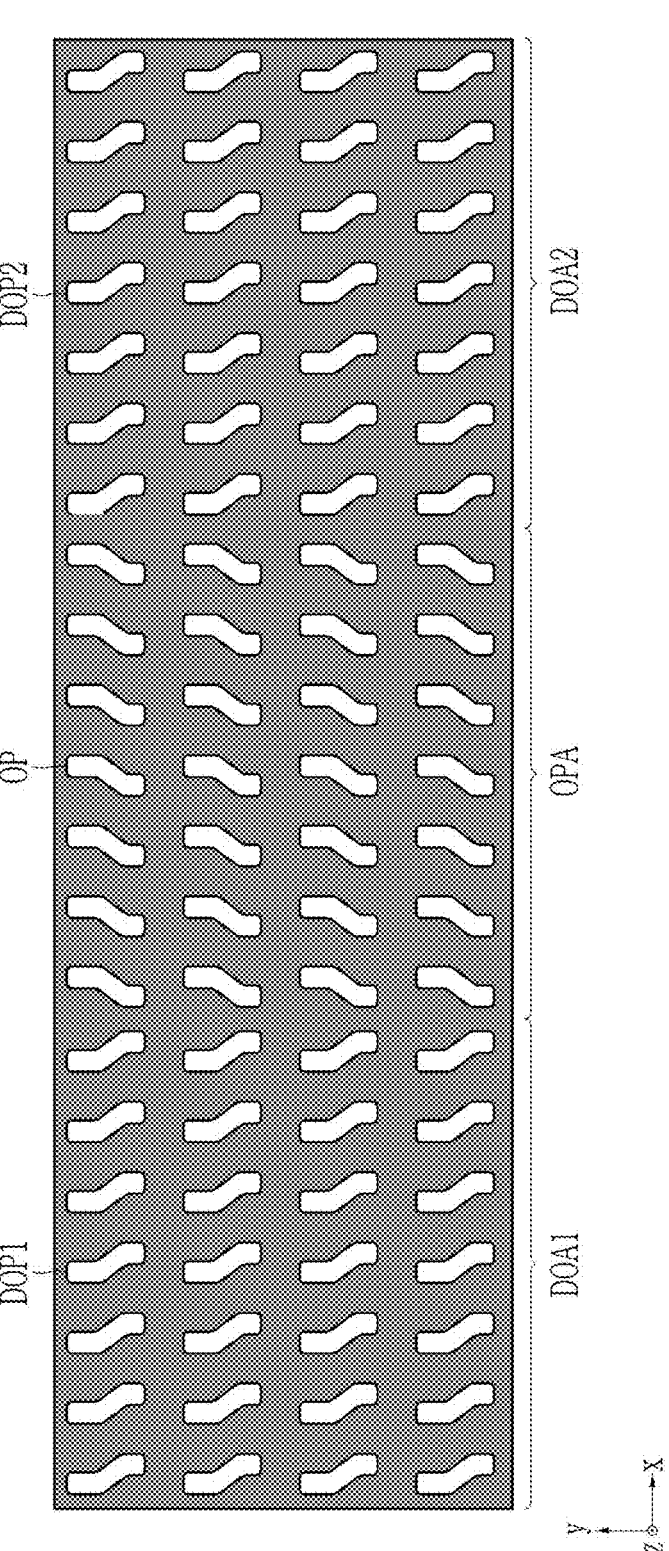
Figure 16:
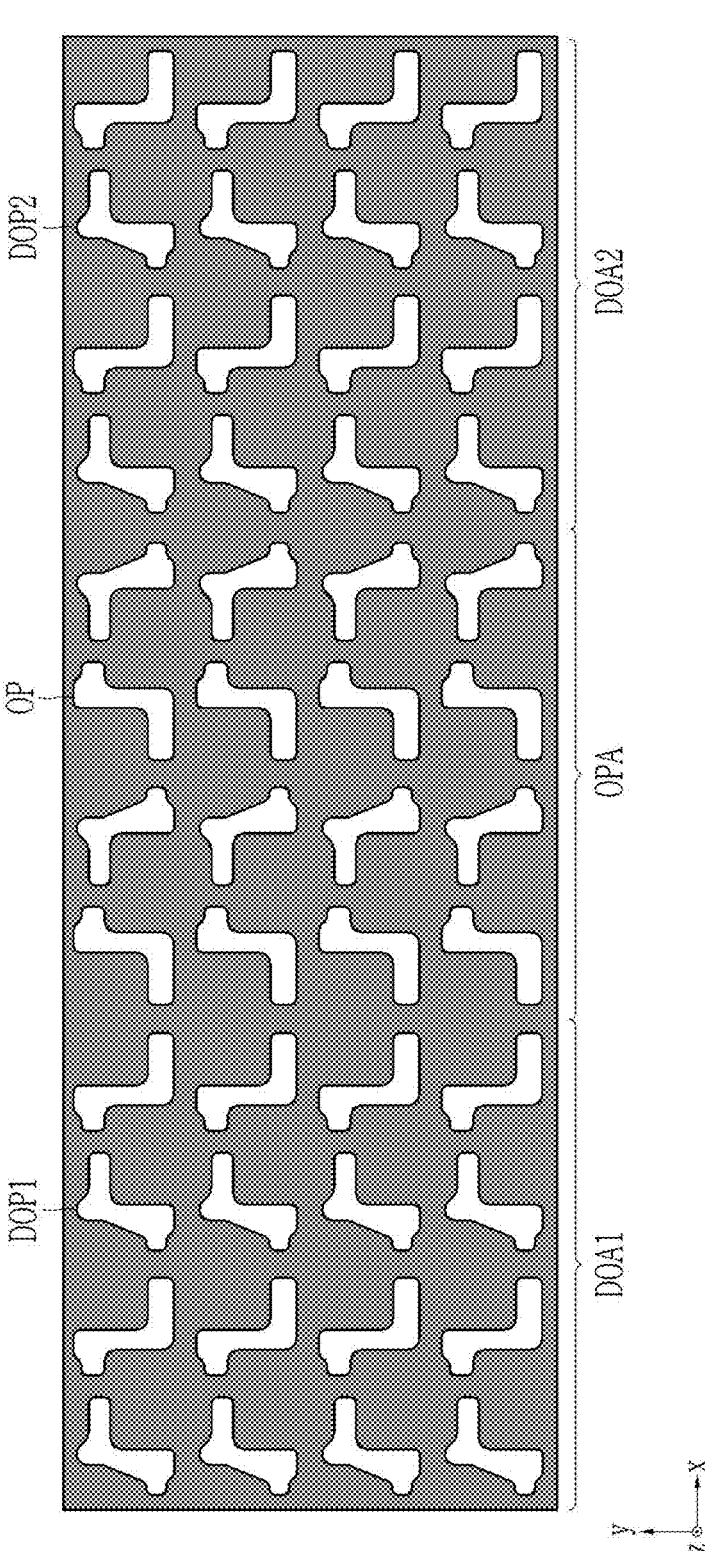

FIG. 14, FIG. 15, and FIG. 16 each illustrate a schematic top plan view of a deposition mask according to an embodiment.

As described above, the compensation structure for ameliorating the distortion of the mask may be applied regardless of a shape of the opening in case that the distortion occurs in case that the mask is tensioned due to asymmetry of the opening, which adversely affects the PPA. For example, as shown in each of FIG. 14, FIG. 15, and FIG. 16, the opening OP formed in the opening area OPA is asymmetrical with respect to the second direction y. In order to ameliorate distortion of the opening area OPA and resulting distortion of the PPA in case that the mask is tensioned, the mask may include a first dummy opening area DOA1 and a second dummy opening area DOA2 at opposite sides of the opening area OPA, and the first and second dummy opening areas DOA1 and DOA2 may include first and second dummy openings DOP1 and DOP2 symmetrical to the openings OP. Although not illustrated, a concave pattern symmetrical to the openings OP may be formed on the second surface of the mask in the opening area OPA. A concave pattern and/or dummy openings DOP1 and DOP2 formed symmetrically with the opening OP may ameliorate the PPA by alleviating the distortion of the opening area OPA caused by the opening OP in case that the mask is tensioned. Even in case that the dummy openings DOP1 and DOP2 are formed, since the dummy openings DOP1 and DOP2 may be shielded by a blocking mask, deposition through the dummy openings DOP1 and DOP2 may be prevented, and deposition may occur only through the opening OP.

The display panel DP that may include the aforementioned low adhesion layer WAL will be described in more detail with reference to FIG. 17.

Figure 17:
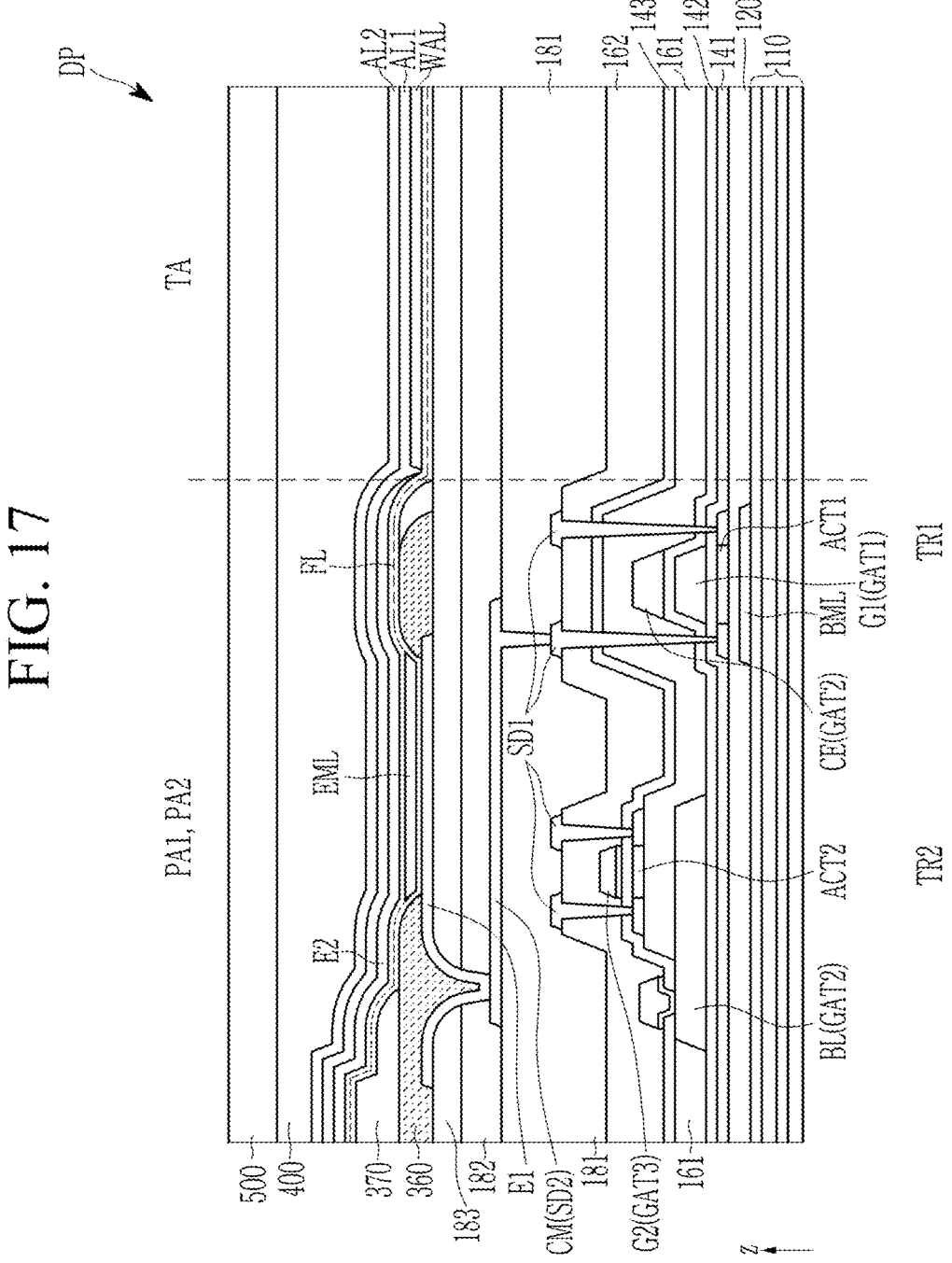
FIG. 17 illustrates a schematic cross-sectional view of a display panel according to an embodiment.

FIG. 17 illustrates a schematic cross-sectional view of a display panel according to an embodiment.

Referring to FIG. 17, the display panel DP may include a substrate 110 and an upper substrate 500. The substrate 110 may be a flexible substrate capable of being bent, folded, or rolled. The substrate 110 may have a structure in which one or more base layers that may include a polymer resin such as polyimide (PI), polyamide (PA), or polyethylene terephthalate (PET), and one or more barrier layers that may include an inorganic insulating material such as a silicon nitride $(SiN_x)$, a silicon oxide $(SiO_x)$, or a silicon oxynitride $(SiO_xN_y)$ may be stacked each other. The substrate 110 may be a rigid substrate such as a glass substrate.

A bottom metal layer (BML) may be positioned on the substrate 110. The lower metal layer BML may overlap the first semiconductor layer ACT1, and incidence of light or electromagnetic waves from a lower portion of the substrate 110 to a channel region of a first semiconductor layer ACT1 may be blocked. The lower metal layer BML may include a metal such as copper (Cu), aluminum (Al), titanium (Ti), or molybdenum (Mo).

A buffer layer 120 may be positioned on the substrate 110 and the lower metal layer BML. The buffer layer 120 may block impurities from the substrate 110 in case that the first semiconductor layer ACT1 is formed, and may planarize a surface of the substrate 110. The buffer layer 120 may include an inorganic insulating material such as a silicon nitride, a silicon oxide, and a silicon oxynitride, and may be a single layer or multiple layers.

A first semiconductor layer ACT1 of the first transistor TR1 may be positioned on the buffer layer 120. The first semiconductor layer ACT1 may include a channel region and first and second regions at opposite sides of the channel region. The first region and the second region may be conductive, and may be a source region or a drain region of the first transistor TR1. The first transistor TR1 may be a driving transistor in a pixel circuit, or a transistor electrically connected to the driving transistor. The first semiconductor layer ACT1 may include any one of amorphous silicon, polysilicon, and an oxide semiconductor. For example, the first semiconductor layer ACT1 may include low temperature polycrystalline silicon (LTPS).

A first gate insulating layer 141 may be disposed on the first semiconductor layer ACT1. The first gate insulating layer 141 may include an inorganic insulating material such as a silicon nitride, a silicon oxide, and a silicon oxynitride, and may be a single layer or multiple layers.

A first gate conductive layer GAT1 that may include the gate electrode G1 of the first transistor TR1 may be positioned on the first gate insulating layer 141. The first gate conductive layer GAT1 may include molybdenum (Mo), aluminum (Al), copper (Cu), titanium (Ti), and the like, and may be a single layer or multiple layers.

A second gate insulating layer 142 may be positioned on the first gate insulating layer 141 and the first gate conductive layer GAT1. The second gate insulating layer 142 may include an inorganic insulating material such as a silicon nitride, a silicon oxide, and a silicon oxynitride, and may be a single layer or multiple layers.

A second gate conductive layer GAT2 that may include a blocking layer BL and an electrode CE of the storage capacitor may be positioned on the second gate insulating layer 142. The blocking layer BL may overlap the second semiconductor layer ACT2, and incidence of light or electromagnetic waves from a lower portion of the substrate 110 to a channel region of the second semiconductor layer ACT2 may be blocked. The electrode CE may overlap the gate electrode G1 to form a storage capacitor. The second gate conductive layer may include molybdenum (Mo), aluminum (Al), copper (Cu), titanium (Ti), and the like, and may be a single layer or multiple layers.

A first interlayer insulating layer 161 may be positioned on the second gate insulating layer 142 and the second gate conductive layer GAT2. The first interlayer insulating layer 161 may include an inorganic insulating material such as a silicon nitride, a silicon oxide, and a silicon oxynitride, and may be a single layer or multiple layers.

The second semiconductor layer ACT2 of the second transistor TR2 may be positioned on the first interlayer insulating layer 161. The second semiconductor layer ACT2 may include a channel region and first and second regions at opposite sides of the channel region. The first region and the second region may be conductive, and may be a source region or a drain region of the second transistor TR2. In the pixel circuit, the second transistor TR2 may be a transistor electrically connected to the first transistor TR1. The second semiconductor layer ACT2 may include any one of amorphous silicon, polysilicon, and an oxide semiconductor. For example, the semiconductor layer may include an oxide semiconductor (for example, indium-gallium-zinc oxide (IGZO)) containing at least one of zinc (Zn), indium (In), gallium (Ga), and tin (Sn).

A third gate insulating layer 143 may be disposed on the second semiconductor layer ACT2. The third gate insulating layer 143 may include an inorganic insulating material such as a silicon nitride, a silicon oxide, and a silicon oxynitride, and may be a single layer or multiple layers.

A third gate conductive layer GAT3 that may include the gate electrode G2 of the second transistor TR2 may be positioned on the third gate insulating layer 143. The third gate conductive layer GAT3 may include molybdenum (Mo), aluminum (Al), copper (Cu), titanium (Ti), and the like, and may be a single layer or multiple layers.

A second interlayer insulating layer 162 may be disposed on the third gate conductive layer GAT3. The second interlayer insulating layer 162 may include an inorganic insulating material such as a silicon nitride, a silicon oxide, and a silicon oxynitride, and may be a single layer or multiple layers.

A first data conductive layer SD1 that may include a connecting member capable of being connected to first and second regions of the first and second transistors TR1 and TR2, respectively, may be positioned on the second interlayer insulating layer 162. The first data conductive layer SD1 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers.

A first organic layer 181 may be disposed on the first data conductive layer. The first organic layer 181 may include an organic insulating material such as a general purpose polymer such as poly(methyl methacrylate) and polystyrene, a polymer derivative having a phenolic group, an acrylic polymer, an imide-based polymer (for example, polyimide), and a siloxane-based polymer.

A second data conductive layer SD2 that may include a connecting member CM may be positioned on the first organic layer 181. The second data conductive layer SD2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers.

A second organic layer 182 and a third organic layer 183 may be positioned on the second data conductive layer SD2. The second organic layer 182 and the third organic layer 183 may contain an organic insulating material such as a general purpose polymer such as poly(methyl methacrylate) or styrene, a polymer derivative having a phenolic group, an acrylic polymer, an imide-based polymer, and a siloxane-based polymer. The third organic layer 183 may be omitted.

An anode E1 may be positioned on the pixel defining layer 183. The anode E1 may be connected to the connecting member CM through contact members formed on the second and third organic layers 182 and 183. The anode E1 may be electrically connected to the first transistor TR1 to receive a driving current for controlling luminance of a light emitting element. The anode E1 may be formed of a reflective conductive material or a translucent conductive material, or may be formed of a transparent conductive material. The first electrode E1 may include a transparent conductive material such as an indium tin oxide (ITO) or an indium zinc oxide (IZO). The first electrode E1 may include a metal such as lithium (Li), calcium (Ca), aluminum (Al), silver (Ag), magnesium (Mg), or gold (Au), or a metal alloy thereof.

A pixel defining layer 360 may be positioned on the third organic layer 183 and the anode E1. The pixel defining 360 may be called a bank or a partition wall, and may have an opening overlapping the anode E1. The pixel defining layer 360 may include an organic insulating material, for example, a general purpose polymer such as poly (methylmethacrylate) (PMMA) or polystyrene (PS), a polymer derivative having a phenolic group, an acrylic polymer, an imide-based polymer, and a siloxane-based polymer. The pixel defining layer 360 may be a black pixel defining layer including a black pigment. For example, the pixel defining layer 360 may include a polyimide binder and a pigment mixed with red, green, and blue. The pixel defining layer 360 may include a cardo binder resin and a mixture of a lactam black pigment and a blue pigment. The pixel defining layer 360 may include carbon black.

A spacer 370 may be positioned on the pixel defining layer 360. The spacer 370 may include an organic insulating material such as an acryl-based polymer, an imide-based polymer, and an amide-based polymer.

A functional layer FL may be positioned on the anode E1, the pixel defining layer 360, and the spacer 370. The functional layer FL may include a lower functional layer that may include a hole injection layer and/or a hole transport layer and an upper functional layer that may include an electron injection layer and/or an electron transport layer. An emission layer EML may be positioned between the lower functional layer and the upper functional layer.

A cathode E2 may be positioned on the functional layer FL. The cathode E2 may be made of a low work function metal such as magnesium (Mg), silver (Ag), aluminum (Al), calcium (Ca), barium (Ba), or a metal alloy thereof, as a thin layer to have light transmittance. The cathode E2 may include a transparent conductive oxide such as an indium tin oxide (ITO) or an indium zinc oxide (IZO). In each pixel, the anode E1, the emission layer EML, and the cathode E2 may form a light emitting element such as an organic light emitting diode. An emission area of the light emitting element may correspond to an emission portion of the pixel.

The cathode E2 may be positioned in the first and second pixel areas PA1 and PA2, and may not be positioned in the transmission area TA. The low adhesion layer WAL may be positioned on the functional layer FL in the transmission area TA. The low adhesion layer WAL may prevent a material forming the cathode E2 from being deposited thereon. Accordingly, the cathode E2 may not be positioned on the low adhesive layer WAL, or may be formed very thin even in case that it is positioned. As a result, it is possible to prevent or reduce the decrease in transmittance in the transmission area TA by the cathode E2, and to improve the transmittance of the transmission area TA. The low adhesion layer WAL may be formed by using a material such as Liq; [8-Quinolinolato Lithium], N,N-diphenyl-N,N-bis(9-phenyl-9H-carbazol-3-yl)biphenyl-4,4'-diamine; HT01, N(diphenyl-4-yl)9,9-dimethyl-N-(4(9-phenyl-9H-carbazol-3-yl) phenyl)-9H-fluorene-2-amine; HT211), or 2-(4-(9,10-di (naphthalene-2-yl)anthracene-2-yl)phenyl)-1-phenyl-1H-benzo-[D]imidazole; LG201. The low adhesion layer WAL may be deposited using the aforementioned low adhesion layer mask MW.

A capping layer AL1 may be positioned on the cathode E2 and the low adhesion layer WAL. The capping layer AL1 may improve light emitting efficiency of the light emitting element by a principle of constructive interference. The capping layer AL1 may include, for example, a material having a refractive index of about 1.6 or higher for light having a wavelength of about 589 nm. The capping layer AL1 may include an organic material, an inorganic material, or an organic material and an inorganic material.

A low reflection layer AL2 may be positioned on the capping layer AL1. The low reflection layer AL2 may include an inorganic material having low reflectivity, and may include a metal or a metal oxide according to an embodiment.

The low reflection layer AL2 induces destructive interference between light incident to an inside of the display device and light reflected from a metal disposed under or below the low reflection layer AL2, thereby reducing external light reflectance. Accordingly, display quality and visibility of the display device may be improved by reducing the external light reflectance of the display device through the low reflection layer AL2.

An encapsulation layer 400 may be positioned on the low reflection layer AL2. The encapsulation layer 400 may encapsulate the light emitting element to prevent penetration of moisture or oxygen from the outside. The encapsulation layer 400 may be a thin film encapsulation layer including a first inorganic layer, an organic layer, and a second inorganic layer.

A touch sensor layer 500 including touch electrodes may be disposed on the encapsulation layer 400. An anti-reflection layer (not illustrated) for reducing external light reflection may be disposed on the touch sensor layer 500.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A deposition mask comprising:
an opening area including an opening;
a first dummy opening area disposed at a first side of the opening area in a first direction and having a first dummy opening in the first dummy opening area; and
a second dummy opening area disposed at a second side of the opening area in the first direction and having a second dummy opening in the second dummy opening area, wherein
a first side and a second side of the opening are asymmetrical with respect to a second direction intersecting the first direction, and
the first dummy opening and the second dummy opening are symmetrical with the opening with respect to the second direction,
wherein
an extending direction of the opening is inclined by a degrees with respect to the second direction, and
an extending direction of the first dummy opening and the second dummy opening is inclined by $-\alpha$ degrees with respect to the second direction.

2. The deposition mask of claim 1, wherein
the first dummy opening area and the second dummy opening area are integral with the opening area.

3. The deposition mask of claim 1, wherein
the first dummy opening and the opening are arranged to substantially coincide with each other in plan view in a folded configuration of the first dummy opening area along a boundary line between the opening area and the first dummy opening area.

4. The deposition mask of claim 1, wherein
the second dummy opening and the opening are arranged to substantially coincide with each other in plan view in a folded configuration of the second dummy opening area along a boundary line between the opening area and the second dummy opening area.

5. The deposition mask of claim 1, wherein
a shape of the first dummy opening is substantially identical a shape of the second dummy opening.

6. The deposition mask of claim 1, wherein
the first dummy opening area and the second dummy opening area are positioned and dimensioned to partially offset distortion of the opening area caused by tension applied to the deposition mask from opposite sides in a direction parallel to the second direction.

7. The deposition mask of claim 1, wherein
the opening area includes a substantially concave pattern that does not overlap the opening of the opening area in plan view.

8. The deposition mask of claim 7, wherein
the substantially concave pattern extends in a direction intersecting an extending direction of the opening of the opening area.

9. The deposition mask of claim 7, wherein
the substantially concave pattern has a larger area than an area of the opening of the opening area.

10. The deposition mask of claim 7, wherein
the opening area includes a boundary portion that surrounds the substantially concave pattern and is thicker than the substantially concave pattern.

11. The deposition mask of claim 1, further comprising:
a blocking mask including an open area which overlaps the open area in plan view,
wherein the first dummy opening area and the second dummy opening area are blocked by the blocking mask.

12. A deposition mask comprising:

an opening area including a first surface and a second surface facing each other, and including an opening;

a substantially concave pattern disposed on the second surface and extending in a direction intersecting an extending direction of the opening; and a boundary portion disposed between the opening and the substantially concave pattern on the second surface and the boundary portion being thicker than the substantially concave pattern.

13. The deposition mask of claim 12, wherein the substantially concave pattern extends in a direction intersecting the extending direction of the opening of the opening area.

14. The deposition mask of claim 12, wherein the extending direction of the opening and an extending direction of the substantially concave pattern are substantially symmetrical.

15. The deposition mask of claim 12, wherein the substantially concave pattern has a larger area than an area of the opening of the opening area.

16. The deposition mask of claim 12, wherein the substantially concave pattern is arranged and dimensioned to partially offsets a distortion of the opening area caused by tension applied to the deposition mask from opposite sides.

17. The deposition mask of claim 12, wherein the boundary portion surrounds the substantially concave pattern.

* * * * *